United States Patent
Yan

(10) Patent No.: US 7,626,843 B2
(45) Date of Patent: Dec. 1, 2009

(54) DYNAMIC RANDOM ACCESS MEMORY AND METHOD FOR ACCESSING SAME

(75) Inventor: Shou-Ting Yan, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 0 days.

(21) Appl. No.: 11/811,746

(22) Filed: Jun. 11, 2007

(65) Prior Publication Data

US 2008/0002449 A1    Jan. 3, 2008

(30) Foreign Application Priority Data

Jun. 9, 2006    (TW) .............................. 95120556 A

(51) Int. Cl.
*G11C 5/06* (2006.01)
(52) U.S. Cl. ........................................ 365/72; 365/149
(58) Field of Classification Search .................... 365/72, 365/149

See application file for complete search history.

(56) References Cited

U.S. PATENT DOCUMENTS

| | | | |
|---|---|---|---|
| 4,682,328 A * | 7/1987 | Ramsay et al. ................. | 714/15 |
| 4,961,167 A | 10/1990 | Kumanoya et al. | |
| 5,105,387 A | 4/1992 | Childers et al. | |
| 5,315,554 A | 5/1994 | Nanba | |
| 5,359,566 A | 10/1994 | Furuyama | |
| 5,375,093 A | 12/1994 | Hriano | |
| 5,640,350 A | 6/1997 | Iga | |
| 5,889,717 A | 3/1999 | Eto | |
| 7,123,514 B2 * | 10/2006 | Watanabe ............... | 365/185.21 |
| 7,145,829 B1 | 12/2006 | Kim | |
| 7,184,298 B2 * | 2/2007 | Fazan et al. .................. | 365/149 |
| 7,388,567 B2 * | 6/2008 | Lin et al. ...................... | 345/92 |
| 2006/0044023 A1 * | 3/2006 | Yun et al. ...................... | 327/74 |

* cited by examiner

*Primary Examiner*—Hoai V Ho
*Assistant Examiner*—Kretelia Graham
(74) *Attorney, Agent, or Firm*—Wei Te Chung

(57) ABSTRACT

An exemplary dynamic random access memory includes a first transistor (210), a second transistor (220) and a comparator (230). The first transistor includes a first gate electrode (211), a first source electrode (213) and a first drain electrode (215). The second transistor includes a second gate electrode (221), a second source electrode (223) and a second drain electrode (225). The first source electrode is connected with the second source electrode. The first drain electrode is an input terminal for inputting a message. The comparator is connected to the second drain electrode, and preconfigured with a reference current. The comparator compares the reference current and a current through the second drain electrode to define a state of the current read from the comparator.

15 Claims, 2 Drawing Sheets

DYNAMIC RANDOM ACCESS MEMORY AND METHOD FOR ACCESSING SAME

BACKGROUND OF THE INVENTION

1. Field of the Invention

The present invention relates to a dynamic random access memory (DRAM), and more particularly to a DRAM having a comparator and a method for accessing the DRAM.

2. General Background

Dynamic random access memories (DRAMs) with functions of write and read have become an important part for modern computers and personal digital systems. Referring to FIG. 3, this is a circuit diagram of a conventional DRAM. The DRAM 10 comprises a transistor 110 and a storage capacitor (Cs) 120. Typically, the transistor 110 is a thin film transistor. The transistor 110 includes a gate electrode 111, a source electrode 113, and a drain electrode 115. The Cs 120 is used for voltage access. One terminal of the Cs 120 is connected to the drain electrode 115, and the other terminal of the Cs 120 is connected to ground.

When a threshold voltage is applied to the gate electrode 111 of the transistor 110, the transistor 110 is turn on. When the transistor 110 is in the on-state, an input voltage is stored in the Cs 120 through the source electrode 113 and the drain electrode 115. Next, when the transistor 110 returns to the on-state again, the stored input voltage in the Cs 120 is read out through a path between the source electrode 113 and the drain electrode 115.

Because the transistor 110 controls the charge and discharge function for the Cs 120 as the conventional DRAM 10 is processing voltage access, a charge leakage may occur and further induce the Cs 120 and the transistor 110. This causes a shorter refresh cycle time. Therefore the refresh process is performed more frequently, and the accumulated time of the DRAM 10 device is increased. That is, the operation speed of the DRAM 10 having a transistor/capacitor structure is far slower than that of a static random access memory (SRAM) having a combination of six transistors. Compared with the SRAM, the performance of the DRAM is very inefficient. Thus there is a need for an improved DRAM structure which obviates one or more of the above-described problems, limitations and disadvantages, and provides efficient performance.

SUMMARY

In one aspect, a dynamic random access memory includes a comparator with an reference current to define an output current state of the comparator.

An exemplary dynamic random access memory includes: a first transistor having a first gate electrode, a first source electrode and a first drain electrode; a second transistor having a second gate electrode, a second source electrode and a second drain electrode, wherein the second source electrode is connected to the first source electrode of the first transistor; and a comparator connected to the second drain electrode, and preconfigured with a reference current. And the reference current is comparing with a current through the drain electrode of the second transistor to define a current state which the comparator reads.

In another aspect, a dynamic random access memory includes: a first transistor having a first gate electrode, a first source electrode and a first drain electrode configured as a first input voltage terminal; a second transistor having a second gate electrode, a second source electrode and a second drain electrode configured as a second input voltage terminal, wherein the second source electrode is connected to the first source electrode of the first transistor; and a potential difference is formed between the second drain electrode and the second source electrode of the second transistor. Then, the potential difference generates a specific current as the second transistor is turned on.

In the other aspect, an access method for a dynamic random access memory having a comparator preconfigured with a reference current includes the steps of: inputting a first voltage in the first source electrode of the first transistor and the second source electrode of the second transistor through the first drain electrode of the first transistor as the first transistor is turned on; inputting a second voltage to the second drain electrode of the second transistor as the second transistor is turned off; generating a current between the second drain electrode and the second source electrode of the second transistor as the second transistor is turned on; and comparing the current and the reference current of the comparator to define an output state of the comparator.

The DRAM adopts the second transistor in place of the storage capacitor of a conventional DRAM. Thus, first parasitic capacitor is formed between the first gate electrode and the first source electrode and a second parasitic capacitor is formed between the first gate electrode and the first source electrode. Due to smaller capacitances of the above-mentioned parasitic capacitors, the charging time of first parasitic capacitor of the first transistor and the third parasitic capacitor of the second transistor is shorter. In another aspect, a voltage can be written and a current can be read on in the DRAM simultaneously. Thus, the parasitic capacitors are not need to discharge and the access rate of the DRAM is faster.

Embodiments of the present invention can be more fully understood by reading the subsequent detailed description and examples with references made to the accompanying drawings, wherein:

DETAILED DESCRIPTION

Hereinafter, preferred and exemplary embodiments of the present invention will be described with the reference to the attached drawings.

Figure 1:
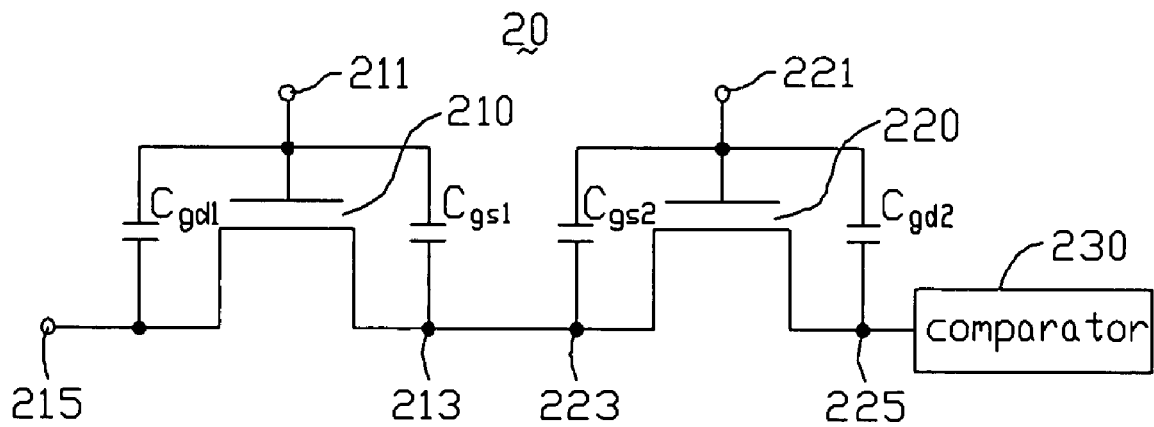
FIG. 1 is a circuit diagram of a DRAM according to an exemplary embodiment of the present invention.

FIG. 1 is a circuit diagram of a dynamic random access memory (DRAM) according to an exemplary embodiment of the present invention. The DRAM 20 includes a first transistor 210, a second transistor 220, and a comparator 230. Typically, the first transistor 210 and the second transistor 220 are thin film transistors. The first transistor 210 includes a first gate electrode 211, a first source electrode 213, and a first drain electrode 215. The second transistor 220 includes a second gate electrode 221, a second source electrode 223, and a second drain electrode 225. In this embodiment, the first source electrode 213 is connected to the second source electrode 223, and the second drain electrode 225 is connected to the comparator 230.

An input voltage is written in the first source electrode 213 and the second source electrode 223 of the DRAM 20. The comparator 230 has a predetermined reference current, which is used for comparison to a current flowing through the second drain electrode 225. The current is defined by the following equation:

$$I = \frac{W}{L}\mu C_{ox} \times \left[(V_{gs} - V_{th})V_{ds} - \frac{1}{2}V_{ds}^2\right]$$

wherein W is the width of the channel of the second transistor 220, L is the length of the channel of the second transistor 220, μ is the electron mobility, $C_{ox}$ is a capacitance of the second gate electrode 221, $V_{gs}$ is a voltage difference between the second gate electrode 221 and the second source electrode 223, $V_{th}$ is a threshold voltage of the second transistor 220, and $V_{ds}$ is a voltage difference between the second drain electrode 225 and the second source electrode 223.

When the current flowing through the second drain electrode 225 is lower than the reference current, a read out current of the comparator 230 is defined as logic "0". When the current flowing through the second drain electrode 225 is higher than the reference current, a read out current of the comparator 230 is defined as logic "1".

Generally, in view of the physical structure of the first transistor 210, the first gate electrode 211 might partially overlap the first source electrode 213 and the first drain electrode 215. In such case, a first parasitic capacitor $C_{gs1}$ is formed between the first gate electrode 211 and the first source electrode 213, and a second parasitic capacitor $C_{gd1}$ is formed between the first gate electrode 211 and the first drain electrode 215. However, an area of overlap of the first gate electrode 211 and the first source electrode 213 can be different to that of the first gate electrode 211 and the first drain electrode 215. Therefore, a capacitance of the first parasitic capacitor $C_{gs1}$ can be different to that of the second parasitic capacitor $C_{gd1}$.

Similarly, a third parasitic capacitor $C_{gs2}$ is formed between the second gate electrode 221 and the second source electrode 223, and a fourth parasitic capacitor $C_{gd2}$ is formed between the second gate electrode 221 and the second drain electrode 225. Furthermore, an area of overlap of the second gate electrode 221 and the second source electrode 223 can be different to that of the second gate electrode 221 and the second drain electrode 225. Therefore, the capacitance of the third parasitic capacitor $C_{gs2}$ can be different to that of the fourth parasitic capacitor $C_{gd2}$.

Typically, the capacitance of the first parasitic capacitor $C_{gs1}$ is larger than that of the second parasitic capacitor $C_{gd1}$; and the capacitance of the third parasitic capacitor $C_{gs2}$ is larger than that of the fourth parasitic capacitor $C_{gd2}$. Thus, the first parasitic capacitor $C_{gs1}$ and the third parasitic capacitor $C_{gs2}$ are individually kept steady voltages of the first source electrode 213 and the second source electrode 223. In the other words, the first parasitic capacitor $C_{gs1}$ and the third parasitic capacitor $C_{gs2}$ retain the input voltage for a predetermined period of time. Furthermore, the input voltage of the first drain electrode 215 results in a small interference of the second parasitic capacitor $C_{gd1}$. And the current of the second drain electrode 225 read out through the comparator 230 also results in a small interference of the fourth parasitic capacitor $C_{gd2}$.

Figure 2:
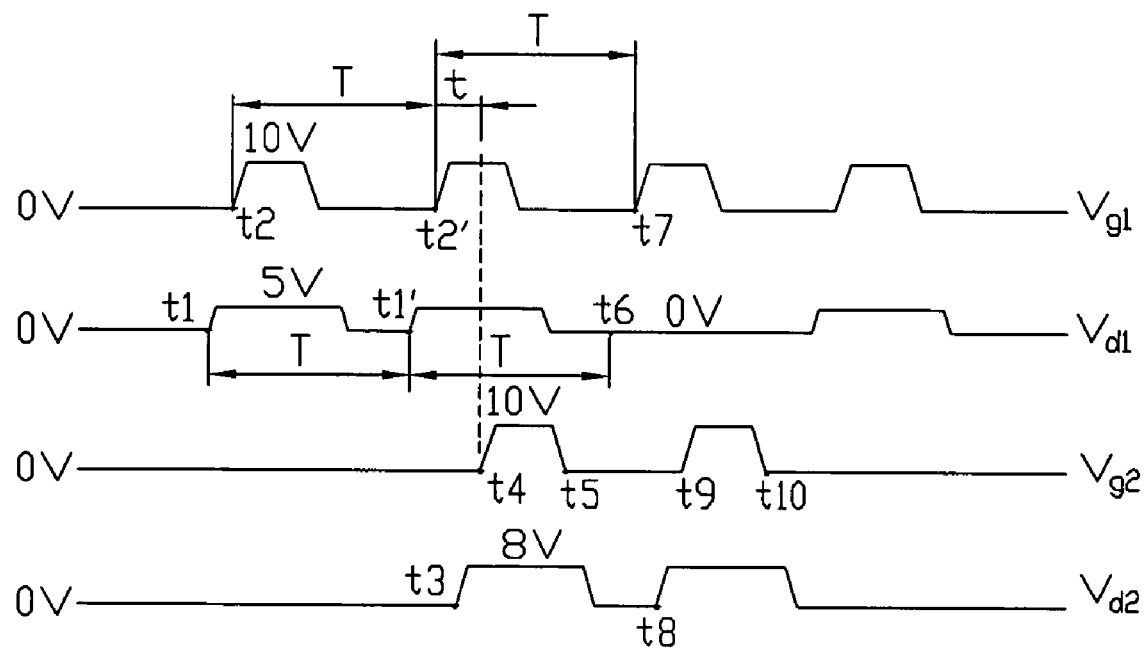
FIG. 2 is a timing diagram for "Write" and "Read" operations of the DRAM of FIG. 1.
Figure 3:
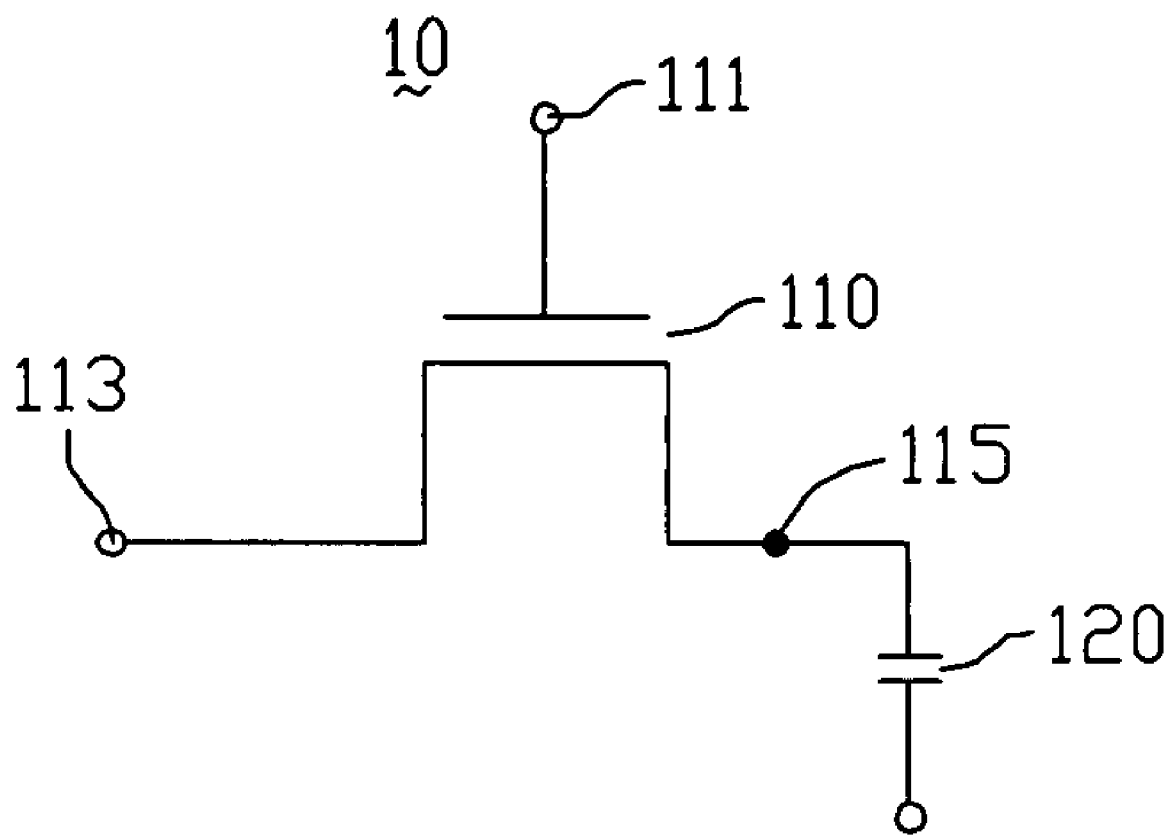
FIG. 3 is a circuit diagram of a conventional DRAM.

An example according to the above-mentioned structure is illustrated below. Typical access functions for the DRAM 20 include "read" and "write". Referring also to FIG. 2, this is a timing diagram of "Read" and "Write" operations of the DRAM 20. In FIG. 2, $V_{g1}$ depicts a voltage curve of the first gate electrode 211, $V_{d1}$ depicts a voltage curve of the first drain electrode 215, $V_{g2}$ depicts a voltage curve of the second gate electrode 221, and $V_{d2}$ depicts a voltage curve of the second drain electrode 225.

Operation of the DRAM 20 according to a preferred embodiment of the present invention is described below with reference to FIGS. 1 and 2.

Firstly, an operation of writing binary coded information in the DRAM 20 is as follows. The first source electrode 213 and the second source electrode 223 are written with an input voltage individually during the period t1 to t4. During the period t1 to t2, a pre-writing operation is performed. During the period t2 to t3, a writing operation is performed for the DRAM 20. During the period t3 to t4, a pre-reading operation is performed.

At time t1, an input voltage (such as 5 volts) is applied to first drain electrode 215.

At time t2, a starting voltage (such as 10 volts) that is not smaller than the threshold voltage required to operate the first transistor 210 is applied to the first gate electrode 211, so that the first transistor 210 is in an on-state. Accordingly, the input voltage (such as 5 volts) is written in the first source electrode 213 and the second source electrode 223.

In order to read a current from the comparator 230, a high voltage (such as 8 volts) is applied to the second drain electrode 225 at time t3.

Then, the DRAM 20 is in a read operation during the period t4 to t5. That is, a current from the comparator 230 can be read. At time t4, a starting voltage (such as 10 volts) is applied to the second gate electrode 221, so that the second transistor 220 is in an on-state. Accordingly, a first potential difference (approximately 3 volts) exists between the second drain electrode 225 and the second source electrode 223, and then a current is generated between the second drain electrode 225 and the second source electrode 223 at the moment the second transistor 220 is turned on. However, if the current is lower than the predetermined reference current of the comparator 230, an output current of the comparator 230 is defined as logic "0". At time t5, the second transistor 220 is set to be in an off-state.

In addition, the period t2 to t3 of the writing operation is used to provide enough charging time for storing the input voltage in the first parasitic capacitor $C_{gs1}$ of the first transistor 210 and the third parasitic capacitor $C_{gs2}$ of the second transistor 220, so as to avoid the first parasitic capacitor $C_{gs1}$ and the third parasitic capacitor $C_{gs2}$ having abnormal voltage levels. In other words, the first parasitic capacitor $C_{gs1}$ and the third parasitic capacitor $C_{gs2}$ retain the input voltage for a predetermined period of time. The charging time takes at least a frame period T, according the preferred embodiment as shown in FIG. 2.

Furthermore, there is an upward period during which the input voltage is raised from 0 volt to 5 volts. An error current will be read from the comparator 230 during the upward period. Thus, a time period t between the time that the second transistor 220 is turned on and the time that the first transistor 210 is turned on is provided. The time period t begins shortly prior to the time the second transistor 220 is turned on, and ends at the time the second transistor 220 is turned on. The time period t is provided for the purpose of avoiding reading of an error current. Accordingly, enough time is provided for raising the input voltage applied to the second source electrode 223 to a predetermined, steady value (or level).

Moreover, if a time period t also can be extended for providing appropriate charging time of the first parasitic capacitor $C_{gs1}$ of the first transistor 210 and the third parasitic capacitor $C_{gs2}$ of the second transistor 220, the first source electrode 213 and the second source electrode 223 can be written with an input voltage individually just during the period t1' to t4. That is, the first transistor 210 only turns on once in the foregoing period. In other words, an operation of writing binary coded information in the DRAM 20 is performed during only a frame period. Similarly, during the period t1' to t2', a pre-writing operation is performed. During the period t2' to t3, a writing operation is performed for the DRAM 20. During the period t3 to t4, a pre-reading operation is performed.

Next, another operation of writing binary coded information in the DRAM 20 is as follows. That is, an input voltage is written in the first source electrode 213 and the second source electrode 223 during the period t6 to t9. During the period t6 to t7 period, the DRAM 20 is performing a pre-writing operation. During the period t7 to t8, the DRAM 20 is performing a writing operation. During the period t8 to t9, the DRAM 20 is performing a pre-reading operation.

At time t6, an input voltage such as 0 volt is applied to the first drain electrode 215.

At time t7, a starting voltage such as 10 volts that is not smaller than the threshold voltage required to operate the first transistor 210 is applied to the first gate electrode 211 so that the first transistor 210 operates in an on-state. Accordingly, the input voltage such as 0 volts is written in the first source electrode 213 and the second source electrode 223.

For the purpose of reading a current from the comparator 230, a high voltage such as 8 volts is applied to the second drain electrode 225 at time t8.

Then, the DRAM 20 is in a read operation during the period t9 to t10. That is, a current from the comparator 230 is read. At t9, a starting voltage (such as 10 volts) is applied to the second gate electrode 221, so that the second transistor 220 is set in an on-state. Accordingly, a potential difference (approximately 8 volts) exist between the second drain electrode 225 and the second source electrode 223, and then a current is generated between the second drain electrode 225 and the second source electrode 223 at the moment the second transistor 220 is turned on. However, if the current is higher than the predetermined reference current of the comparator 230, an output current that can be read from the comparator 230 is defined as logic "1". At time t10, the second transistor 220 operates is set to be an off-state.

In other words, the logic "0" and "1" of the DRAM 20 corresponds to the variation current or voltage of the second transistor 220.

Obviously, the second transistor 220 of the DRAM 20 substitutes for the storage capacitor 120. As the DRAM 20 performs in a "Write" operation, the charging time of the first parasitic capacitor $C_{gs1}$ of the first transistor 210 and the third parasitic capacitor $C_{gs2}$ of the second transistor 220 is shorter due to smaller capacitances of the above-mentioned storage capacitor (Cs) 120. In another aspect, a voltage can be written and a current can be read in the DRAM 20 simultaneously. Thus, it is not necessarily to discharge the parasitic capacitors $C_{gs1}$ and $C_{gs2}$ and resulted in a faster access rate of the DRAM 20.

In addition, the first and second transistors 210, 220 are preferably the same type of thin film transistor. For example, the first and second transistors 210, 220 both be n-type thin film transistors, and have the same threshold voltage.

In addition, the input voltage and the starting voltage are periodic applied to the transistor due to a steady access. That is, a refresh period of the input voltage and the starting voltage is adopted to avoid the leakage of the transistor. The period of the input voltage is same as that of the starting voltage and the periods T are both between 15 microseconds to 64 milliseconds.

While the above description has been by way of examples and in terms of preferred and exemplary embodiments, it is to be understood that the invention is not limited thereto. To the contrary, the above description is intended to cover various modifications and similar arrangements, including modifications and similar arrangements that would be apparent to those skilled in the art. Therefore, the scope of the appended claims should be accorded the broadest interpretation so as to encompass all such modifications and similar arrangements.

What is claimed is:

1. A dynamic random access memory comprising:
   a first transistor having a first gate electrode, a first source electrode and a first drain electrode, the first drain electrode being configured as a first input voltage terminal;
   a second transistor having a second gate electrode, a second source electrode and a second drain electrode, wherein the second source electrode is connected to the first source electrode of the first transistor; and
   a comparator connected to the second drain electrode, and preconfigured with a reference current;
   wherein a first parasitic capacitor is formed between the first gate electrode and the first source electrode of the first transistor, and the first parasitic capacitor retains the input voltage for a predetermined period of time; and
   a first input voltage or a second input voltage is applied to the first drain electrode when the first transistor is in an on-state and the second transistor is in an off-state; and
   a second voltage which is greater than the first and second input voltages is applied to the second drain electrode when the first transistor is in an off-state and the second transistor is in an on-state.

2. The dynamic random access memory as claimed in claim 1, wherein a second parasitic capacitor is formed between the first gate electrode and the first drain electrode of the first transistor, and a capacitance of the second parasitic capacitor is smaller than that of the first parasitic capacitor.

3. The dynamic random access memory as claimed in claim 2, wherein a third parasitic capacitor is formed between the second gate electrode and the second source electrode of the second transistor, and the third parasitic capacitor retains the input voltage for a predetermined period of time.

4. The dynamic random access memory as claimed in claim 3, wherein a fourth parasitic capacitor is formed between the second gate electrode and the second drain electrode of the second transistor, and a capacitance of the fourth parasitic capacitor is smaller than that of the third parasitic capacitor.

5. The dynamic random access memory as claimed in claim 1, wherein a current is created by a potential difference formed between the second drain electrode and the second source electrode of the second transistor when the second transistor is turned on.

6. The dynamic random access memory as claimed in claim 5, wherein when the current through the second drain electrode of the second transistor is smaller than the reference current, an output state of the comparator is defined as logic "0", and when the current through the second drain electrode of the second transistor is larger than the reference current, the output state of the comparator is defined as logic "1".

7. An access method for a dynamic random access memory, the dynamic random access memory comprising a first transistor having a first source electrode and a first drain electrode, a second transistor having a second source electrode and a second drain electrode, and a comparator preconfigured with a reference current, the method comprising:
   inputting a first voltage in the first source electrode of the first transistor and the second source electrode of the second transistor through the first drain electrode of the first transistor as the first transistor is turned on;

inputting a second voltage to the second drain electrode of the second transistor as the second transistor is turned off;

generating a current between the second drain electrode and the second source electrode of the second transistor as the second transistor is turned on; and comparing the current and the reference current of the comparator to define an output state of the comparator;

wherein a time period begins shortly prior to the time the second transistor is turned on, and the time period is provided for raising the second input voltage to a predetermined value.

8. The method in accordance with claim 7, further comprising applying a third voltage to turn on the first transistor.

9. The method in accordance with claim 8, further comprising applying a fourth voltage to turn on the second transistor.

10. The method in accordance with claim 9, wherein the third voltage is 10 volts and the fourth voltage is 10 volts.

11. The method in accordance with claim 9, wherein periods of the third voltage and the first voltage arc 15 μs to 64 ms.

12. The method in accordance with claim 7, wherein when the current is larger than the reference current, an output state is defined as logic "1".

13. The method in accordance with claim 7, wherein when the current is smaller than the reference current, an output state is defined as logic "0".

14. The method in accordance with claim 7, wherein the second transistor further has a second gate electrode, and the time period is providing enough time for charging a parasitic capacitor between the second gate electrode and the second source electrode of the second transistor.

15. The method in accordance with claim 7, further comprising turning off the first transistor during a first frame period and inputting a next first voltage as the first transistor is turned on during a second frame period.

* * * * *